(12) United States Patent
Weiderstrand et al.

(10) Patent No.: US 11,476,682 B2
(45) Date of Patent: Oct. 18, 2022

(54) SERVER DEVICES, MACHINES, BATTERY DEVICES AND METHODS FOR MANAGING USAGE OF ONE OR MORE BATTERY DEVICES

(71) Applicant: SONY NETWORK COMMUNICATIONS EUROPE B.V., Hoofddorp (NL)

(72) Inventors: Carl-Johan Weiderstrand, Lomma (SE); Rickard Ljung, Helsingborg (SE)

(73) Assignee: SONY NETWORK COMMUNICATIONS EUROPE B.V., Hoofddorp (NL)

( * ) Notice: Subject to any disclaimer, the term of this patent is extended or adjusted under 35 U.S.C. 154(b) by 235 days.

(21) Appl. No.: 16/889,323

(22) Filed: Jun. 1, 2020

(65) Prior Publication Data
US 2021/0006079 A1    Jan. 7, 2021

(30) Foreign Application Priority Data
Jul. 5, 2019    (SE) .................................... 1950855-5

(51) Int. Cl.
*H02J 7/00*    (2006.01)
*G01R 31/392*    (2019.01)

(52) U.S. Cl.
CPC .......... *H02J 7/0025* (2020.01); *G01R 31/392* (2019.01); *H02J 7/00032* (2020.01); *H02J 2207/40* (2020.01)

(58) Field of Classification Search
CPC .. H02J 7/0025; H02J 7/00032; H02J 2207/40; H02J 7/00036; H02J 7/005;
(Continued)

(56) References Cited

U.S. PATENT DOCUMENTS 9,217,779 B2    12/2015    Xu et al.
9,316,694 B2    4/2016    Campbell et al.
(Continued)

FOREIGN PATENT DOCUMENTS

CN    202094243 U    12/2011
CN    109087179 A    12/2018
(Continued)

OTHER PUBLICATIONS

Search Report, SE Patent Application No. 1950855-5, dated Feb. 6, 2020, 11 pp.
(Continued)

*Primary Examiner* — Stacy Whitmore
(74) *Attorney, Agent, or Firm* — Myers Bigel, P.A.

(57) ABSTRACT

A server device is provided, the server device comprising a processing circuitry, a memory circuitry, an interface circuitry configured to connect to a communication network. The server device is configured to obtain machine data indicative of one or more features of a machine. The machine is configured to be powered by a battery device. The server device is configured to obtain usage data indicative of a usage of the machine. The server device is configured to obtain, for one or more battery devices, battery data indicative of one or more battery parameters of a battery device. The server device is configured to determine, for the one or more battery devices, a predicted impact on the one or more battery parameters based on the battery data, the usage data, and the machine data.

16 Claims, 7 Drawing Sheets

(58) Field of Classification Search
CPC ...... G01R 31/392; Y02D 30/70; Y02E 60/10; H04W 52/0277; H04W 52/0296; H04W 52/0258; G06F 1/266; H01M 10/4207; H01M 10/425; H01M 2010/4271; H01M 2010/4278

See application file for complete search history.

(56) References Cited

U.S. PATENT DOCUMENTS

| | | | | |
|---|---|---|---|---|
| 9,618,993 | B2* | 4/2017 | Murawski | G06F 1/329 |
| 10,006,967 | B2 | 6/2018 | Ganesan et al. | |
| 11,056,902 | B2* | 7/2021 | Muntes | G06F 1/3265 |
| 11,152,806 | B2* | 10/2021 | Maluf | H02J 7/00041 |
| 11,165,268 | B2* | 11/2021 | Sethi | G06F 1/263 |
| 2011/0082621 | A1 | 4/2011 | Berkobin et al. | |
| 2013/0262002 | A1 | 10/2013 | Braun et al. | |
| 2015/0212565 | A1* | 7/2015 | Murawski | H04W 52/0258 713/340 |
| 2015/0323974 | A1 | 11/2015 | Shuster et al. | |
| 2017/0004712 | A1 | 1/2017 | Yang | |
| 2017/0256006 | A1 | 9/2017 | Erestam | |
| 2017/0353039 | A1* | 12/2017 | Sunyi | G06F 1/266 |
| 2018/0115170 | A1 | 4/2018 | Bacarella et al. | |
| 2018/0115955 | A1* | 4/2018 | Bacarella | H04W 4/025 |
| 2018/0340982 | A1* | 11/2018 | Kohtz | G01R 31/387 |
| 2019/0207398 | A1 | 7/2019 | Shih et al. | |
| 2019/0305383 | A1* | 10/2019 | Muntes | H01M 10/425 |
| 2020/0014218 | A1* | 1/2020 | Maluf | H02J 7/00041 |
| 2021/0288509 | A1* | 9/2021 | Werner | H02J 7/00041 |

FOREIGN PATENT DOCUMENTS

| | | | | |
|---|---|---|---|---|
| JP | 2015-15875 A | | 1/2015 | |
| WO | WO-2012154451 A2 * | 11/2012 | | B60L 11/184 |
| WO | WO-2020115761 A * | 6/2020 | | |

OTHER PUBLICATIONS

"Communication with European Search Report", EP Application No. 20177433.8, dated Nov. 20, 2020, 9 pp.

* cited by examiner

SERVER DEVICES, MACHINES, BATTERY DEVICES AND METHODS FOR MANAGING USAGE OF ONE OR MORE BATTERY DEVICES

RELATED APPLICATION

The present application claims the benefit of and priority to Swedish Patent Application No. 1950855-5, filed Jul. 5, 2019, the disclosure of which is incorporated herein by reference in its entirety.

FIELD

The present disclosure pertains to the field of battery powered machines, battery devices and related server devices. More specifically, the present disclosure relates to methods for managing usage of one or more battery devices, related server devices, related machines, and related battery devices.

BACKGROUND

Many machines (for example, a screw driver machine, a scooter machine, a drilling machine) are battery powered by battery devices connectable to the machines. More and more machines and battery devices are capable of connecting to the Internet as part of the movement towards Web 3.0, smart devices, or "internet of things".

SUMMARY

Depending on the machine and/or the type of intended usage of the machine, the battery device may be selected from a group of battery devices. This raises issues, such as how to identify the appropriate battery device to use for a given machine and/or type of usage. For example, the battery device can be characterized into battery characteristics. However, the battery characteristics may not be sufficient in identifying the appropriate battery device to use for a given machine and/or type of usage, in that selecting solely based on the battery characteristics does not take into account for example the required machine power consumption to perform a given task, and parameters characterizing the user performing the task (for example a professional user, and/or a private user).

Accordingly, there is a need for server devices, battery devices, machines and methods for managing usage of one or more battery devices.

A server device is provided, the server device comprising a processing circuitry, a memory circuitry, an interface circuitry configured to connect to a communication network. The server device is configured to obtain machine data indicative of one or more features of a machine. The machine is configured to be powered by a battery device. The server device is configured to obtain usage data indicative of a usage of the machine. The server device is configured to obtain, for one or more battery devices, battery data indicative of one or more battery parameters of a battery device. The server device is configured to determine, for the one or more battery devices, a predicted impact on the one or more battery parameters based on the battery data, the usage data, and the machine data.

Disclosed is a method, performed by a server device, for managing usage of one or more battery devices. The server device is configured to connect to a communication network. The method comprises obtaining machine data indicative of one or more features of a machine, wherein the machine is configured to be powered by a battery device. The method comprises obtaining usage data indicative of a usage of the machine. The method comprises obtaining, for one or more battery devices, battery data indicative of one or more battery parameters of a battery device. The method comprises determining, for the one or more battery devices, a predicted impact on the one or more battery parameters based on the battery data, the usage data, and the machine data.

The present disclosure provides a computer readable storage medium storing one or more programs, the one or more programs comprising instructions, which when executed by a server device comprising a processing unit cause the server device to perform any of the methods disclosed herein.

The disclosed method and the disclosed server device advantageously provide an improved estimation of the impact of a planned usage of a battery device by a machine operated according to a certain usage pattern on the one or more battery parameters. This further permits to improve the management and selection of a battery device to be used with a given machine by a given user. The disclosed method and the disclosed server device advantageously allow to identify battery devices that still have acceptable battery characteristics but with a certain predicted future usage would still be drained too much for the tasks to be performed by a given machine and a given user. For example, a new battery device may cope with larger maximum current drains than a battery device that has been used for many charging cycles already. The disclosed method and the disclosed server device provide a management of the battery devices based on an estimated future usage function by determining, for the one or more battery devices, the predicted impact on the one or more battery parameters.

Further, a machine is provided. The machine is to be powered by an external battery device, the machine comprising: a processing circuitry, a memory circuitry, an interface circuitry configured to connect to a communication network. The machine is configured to transmit, via the interface circuitry, user data indicative of a current usage of the machine by a certain type of usage type, e.g. by a certain user.

A battery device to power a machine is disclosed, the battery device comprising a battery pack for storing electrical energy and having a contact for supplying power to the machine. The battery device comprises a processing circuitry and a memory circuitry. The battery device comprises an interface circuitry for communicating with a communication network. The battery device is configured to transmit, via the interface circuitry, user data indicative of a current usage of the machine.

The present disclosure addresses the situation where the best performing battery device is used more often, leaving other batteries not used. The estimation of the future intended use further based on user data from the machine and the battery device allows to improve the selection of battery devices.

A service provider device is disclosed, the service provider device comprising a processing circuitry, a memory circuitry, an interface circuitry configured to connect to a communication network. The service provider device is configured to transmit, to a server device, a request for a matching battery device and to receive a response.

A system is disclosed, the system comprising: a server device disclosed herein; a battery device, and a machine.

Further, the present disclosure in one or more embodiments enables an optimization of the utilization ratio of battery devices within a fleet of battery devices.

BRIEF DESCRIPTION OF THE DRAWINGS

The above and other features and advantages of the present disclosure will become readily apparent to those skilled in the art by the following detailed description of example embodiments thereof with reference to the attached drawings, in which.

DETAILED DESCRIPTION

Various example embodiments and details are described hereinafter, with reference to the figures when relevant. It should be noted that the figures may or may not be drawn to scale and that elements of similar structures or functions are represented by like reference numerals throughout the figures. It should also be noted that the figures are only intended to facilitate the description of the embodiments. They are not intended as an exhaustive description of the disclosure or as a limitation on the scope of the disclosure. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

In the present disclosure, the inventors have found that multiple data sets (such as parameter sets) may affect a "likely" battery life of a battery device. A data set may relate to battery data (for example, a status of the battery itself (such as specifications of the battery device, how historical usage of the battery have impacted its performance etc.)). A data set may relate to machine data (such as specifications of the machine, power consumption estimation etc.). A data set may relate to usage data (such as which type or machine is to be used, what is the expected usage pattern for the user that intends to use the machine).

The disclosure provides, in one or more example embodiments, an estimation of for example an expected battery life taken these data sets into account. The present disclosure may be seen as addressing how to use or exploit the data sets, possibly in a standardized manner, to be able to compare battery devices for a specific usage of a specific machine, such as by a specific user or user type.

In one or more embodiments, a user may comprise a human being and/or a robotic machine.

A battery device can be characterized by battery data (such as remaining % of battery voltage level, historical battery drain (such as battery drops in voltage level with X % per hour). Battery data may be used to estimate remaining battery life in time (which in turn leads to an estimation of a remaining possible machine usage time). For example, battery data may comprise a battery health status parameter set. The battery data may be constructed by taking a set of individual battery status parameters into account. A battery status parameter may comprise one or more of: a max charge level parameter, a reloaded cycles parameter, a max current drain parameter, a battery voltage parameter, and a temperature range parameter.

It may be appreciated that estimating the impact of usage on battery health solely based on battery data is suboptimal because this does not take into account the type of machine and the user behavior.

The disclosed technique allows estimation of impact even when the type of machine and/or the usage pattern is not static The figures are schematic and simplified for clarity, and they merely show details which may aid understanding the disclosure, while other details have been left out. Throughout, the same reference numerals are used for identical or corresponding parts.

Figure 1A:
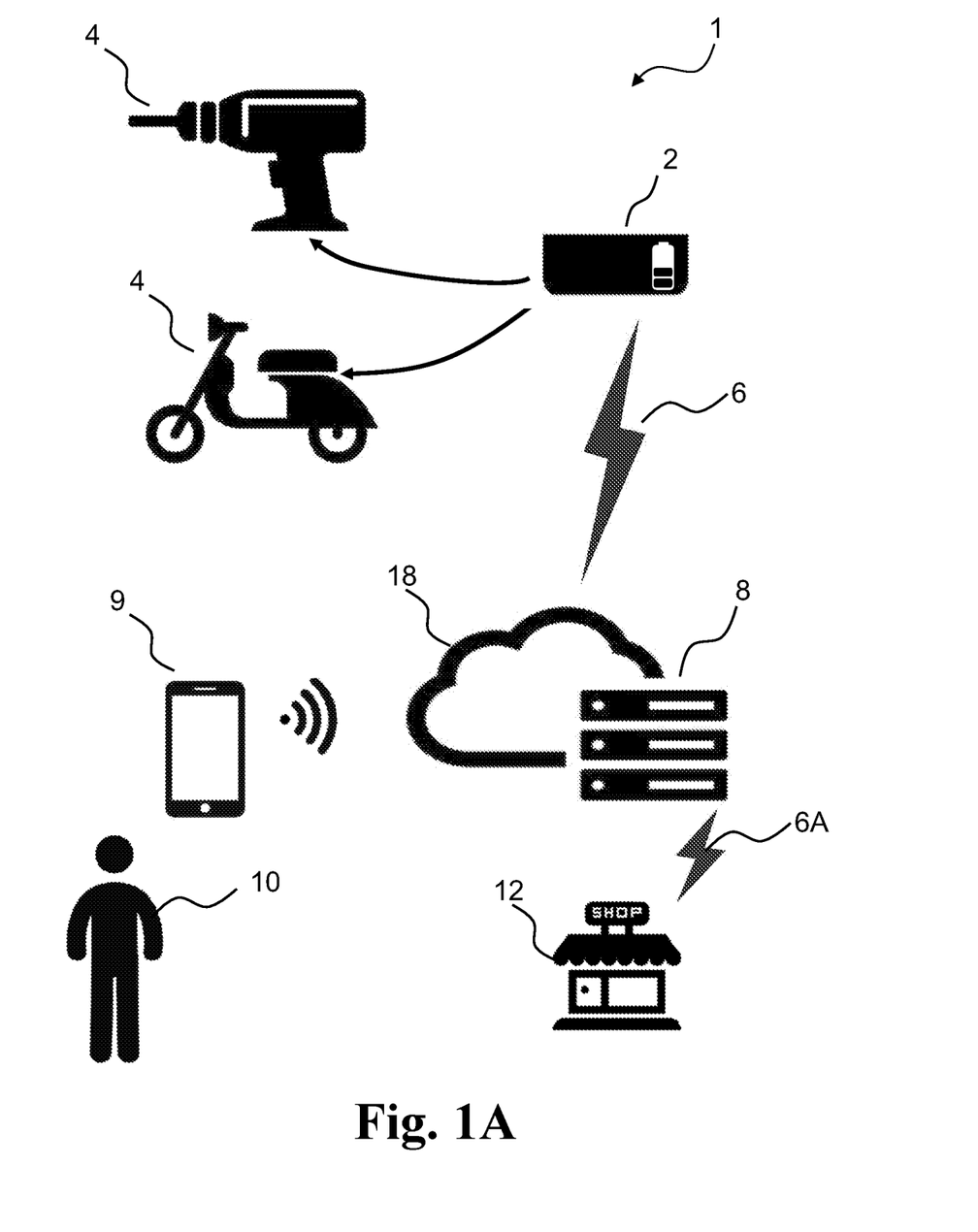
FIGS. 1A-B are diagrams illustrating example systems according to one or more example embodiments of this disclosure.

FIG. 1A is a diagram illustrating an example system 1 according to one or more example embodiments of this disclosure.

The system 1 comprises an example server device 8, an example battery device 2, and an example machine 4. The server device 8 is configured to manage usage of one or more battery devices 2, that may be used to power one or more machines 4.

A battery device may commonly be referred to as a battery, and/or a power storage. A battery device may refer to a device comprising one or more electrochemical cells with external connections provided to power electrical machines. The battery device disclosed herein comprises a battery pack for storing electrical energy and having a contact for supplying power to a machine.

FIG. 1A shows an example battery device 2 configured to supply power to different machines 4, e.g. a power drill and an electric scooter. The battery device 2 is configured to be couplable to a machine 4 so that when coupled to the machine 4, the battery device 2 is configured to supply power to the machine 4. The battery device 2 is configured to supply power to one machine 4 at a time when coupled.

The disclosure can be applied to a large variety of machines which are battery powered such as, but not limited to vehicles (for example, bicycles, scooters, cars and other vehicles, drones), smart metering systems, portable cameras, garden machines, power tools such as drivers, drills, saws, grinders, sanding machines, milling machines etc.

The battery device 3 may be configured to communicate via a communication network 18 (for example via a wireless and/or wired network connection 6) with a server device 8. The machine may be configured to communicate via a communication network 18 (for example via a wireless and/or wired network connection 6) with the server device 8.

A user device 9 (for example, a mobile phone, a tablet, an electronic device) capable of accessing the server 8 is also shown as an optional feature. The user device may be under the control of a user 10. The user 10 may be characterized by one or more parameters (such as a user identifier and/or a user type identifier). The user 10 may use the machine 4 and need a battery device 2 that is appropriate for the intended use (for example intended duration, intended consumption and/or intended task).

The system 1 optionally comprises a service provider device 12 configured to communicate via a communication network 18 (for example via a wireless and/or wired network connection 6A) with the server device 8.

The battery device 2 can be used to connect or couple to various machines 4. For example, the same battery device may be used for different tools and for different users, which allows reaching a wider usage of the battery devices. It may be envisaged that in some scenarios, a service provider 12 uses connected battery devices as part of a renting service or other use cases.

An "intelligent" battery device disclosed herein provides tools which permit an improved characterization of an individual battery health and allow the server device 8 to determine for example an expected lifetime depending on how the battery device has been used previously and how the battery device is expected to be used in the future.

The present disclosure deals with battery devices and management thereof with respect to machines to be coupled with the battery devices for an intended use by a certain of usage type, e.g. according to a usage type, e.g. by a user. For example, the disclosed method and the disclosed server device 8 enable an estimation of an expected remaining battery life, as an impact of an intended usage on one or more battery parameters. Various example use cases may illustrate applications of the disclosure. For example, a user 10 may be offered (such as preparing to use or buy or rent) a battery device 2 and may want to know the expected battery life without recharge in order to estimate whether the intended task is possible to perform without a recharge. Alternatively, the user 10 may want to estimate how frequently a recharge is needed to perform the intended task.

In an example, the user 10 may be offered (such as preparing to use or buy or rent) a battery device and wants to know how long time (weeks, months, years) the battery device may be used until the battery device is unusable and should be replaced (recycled) and thereby assess the impact of the intended use on the health of the battery device.

In an example, a user 10 may be provided by the disclosed system a current charging levels or typical range for available machines (such as vehicles possible to rent), and also a tailored personal estimation of how long (e.g. in time or distance) the user 10 would be able to use each machine or each specific vehicle.

The present disclosure provides a system disclosed herein, the system comprising: a server device disclosed herein; a battery device (optionally as disclosed herein), and a machine (optionally as disclosed herein).

Figure 1B:
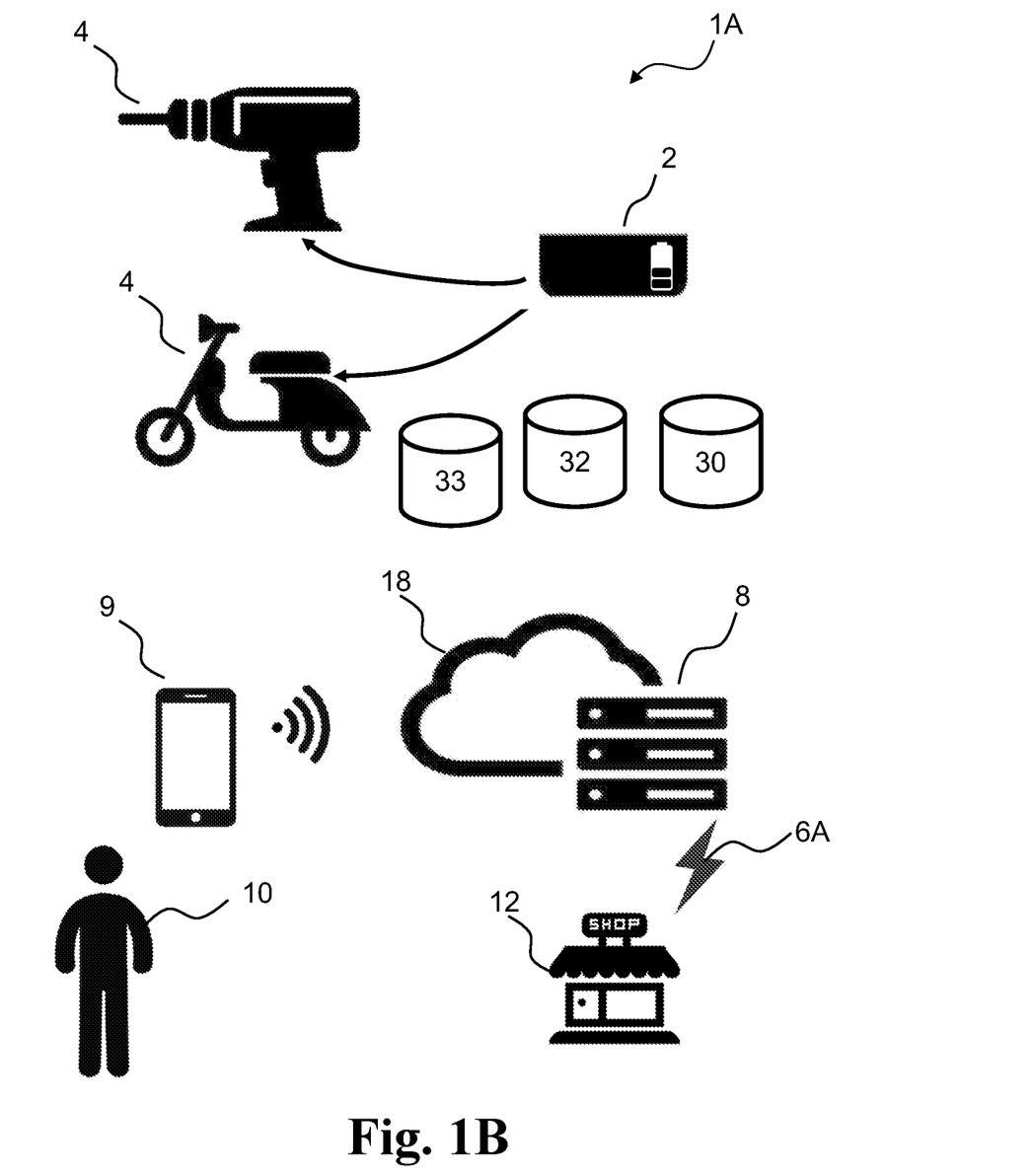

FIG. 1B a diagram illustrating an example system 1A according to one or more example embodiments of this disclosure.

The system 1A comprises entities of FIG. 1A such as: an example server device 8, an example battery device 2, and an example machine 4. The server device 8 is configured to manage usage of one or more battery devices 2, that may be used to power one or more machines 4.

The system 1A comprises a battery characterization unit 30 configured to collect data from one or more battery devices 2, and to store the collected data as battery data. The battery characterization unit 30 may be configured to communicate via a communication network 18 with the server device 8. The battery characterization unit 30 may be configured to communicate via a communication network with the one or more battery devices 2 so as to collect the battery data.

The battery characterization unit 30 may comprise a database which stores values (such as static and/or dynamic values) of the batteries that are used in the system. In one or more embodiments, a battery is equipped with a processor circuitry, a memory circuitry and an interface circuitry (such as connectivity unit). The battery characterization unit 30 may be configured to receive battery data (such as dynamic (and also possibly static) battery characterization parameters) from the battery device(s) 2. In one implementation, an interface circuitry (such as ordinary IP traffic over Internet) is used by a device of a service provider, such as battery rental store, or a device rental store. The interface circuitry can be used to transmit a request (such as an estimation query), and to receive a response. Such request for example can include the type of query requested as well as identifiers for battery devices, an identifier for a machine and a user identity and/or user identities. The server device 8 may request data from the respective characterization units and use the data them to determine a predicted impact on the one or more battery parameters.

The system 1A comprises a machine characterization unit 32 configured to collect data from one or more machines 4, and store the collected data as machine data. The machine characterization unit 32 may be configured to communicate via a communication network 18 with the server device 8. The machine characterization unit 32 may be configured to communicate via a communication network with the one or more machines 4 so as to collect the machine data.

The machine 4 may comprise with a processor circuitry, a memory circuitry and an interface circuitry (such as a connectivity unit). The machine 4 may be configured to transmit machine data (such as machine specific characterization parameters) to the machine characterization function 32. Further the machine 4 may comprise a display, user interaction functions, fingerprint reader, local connectivity functions configured to identify the user using the machine. The machine characterization function can also be updated with user specific information when using the machine. Alternatively, a separate user pattern storing function may reside in a separate unit, such as a user device 9 (such as a portable electronic device, such as smartphone and/or another unit which can be used by the user 10). The user device 9 can be used to collect user data when using a specific machine and transmit this information to the machine characterization unit. In one or more embodiments, the machine characterization unit may comprise a user characterization unit.

In one or more embodiments, when the user is a robotic machine, the robotic machine may be configured to collect usage data and/or machine data and/or user data, In one or more embodiments, the communication of machine data, and/or of user data may be transmitted using the same connectivity unit, such as a connectivity unit residing within the battery device 2 or within the machine 4. Appropriate communication interfaces are then used to communicate between battery device 2 and machine 4, such as a physical communication interface or via wireless local connectivity.

In one or more embodiments, a characterization unit includes a stored database of respective data characterizations. The database is based on a standardized set of such characterizations, that can be used by the entity combining the data towards future battery life calculations. Also, specific storage of additional details may be envisioned, such as manufacturer specific data storage of parameters related to specific brands of batteries or machines. But for the system to operate for any combination of manufacturers, a standardized set of characterizations may be advantageous.

The system 1A comprises a usage characterization unit 33 configured to collect user data from one or more machines 4 and/or battery devices coupled with the one or more machines when in use by a given user, and store the collected user data as usage data. The usage characterization unit 33 may be configured to communicate via a communication network 18 with the server device 8. The usage characterization unit 32 may be configured to communicate via a communication network with the one or more machines 4 so as to collect the user data and/or the one or more battery devices coupled with the one or more machines when in use by a given user.

A characterization unit (such as 30, 32, 33) may comprise a processor, a memory and interface. The characterization units disclosed herein may serve as database for the respective data. A characterization unit may be in form of a logical entity implementing a characterization function. For illustrative purposes, characterization units 30, 32, 33 are separated, while in certain implementations two or more of the characterization units may reside within the same logical entity and/or the same physical unit.

FIG. 1B illustrates an example of characterization units for data collections, data storage and their usage according to one or more embodiments of this disclosure. FIG. 1B shows three characterization units which may act as servers and/or functions for storing static and dynamic parameters of the different corresponding components.

The disclosed system illustrated in FIGS. 1A-B illustrates that the characterization of battery and usage (such as of machine+user, alternatively of battery, machine and usage) may be combined to derive the disclosed technique in one or more embodiments. This can be utilized for a user and/or for a service provider, for evaluating the suitability of battery device as mapped to usage. The disclosed technique for example offers an indication of battery load/effort for e.g. expected time until required recharge and/or expected time until battery device needs to be replaced and recycled.

Figure 2:
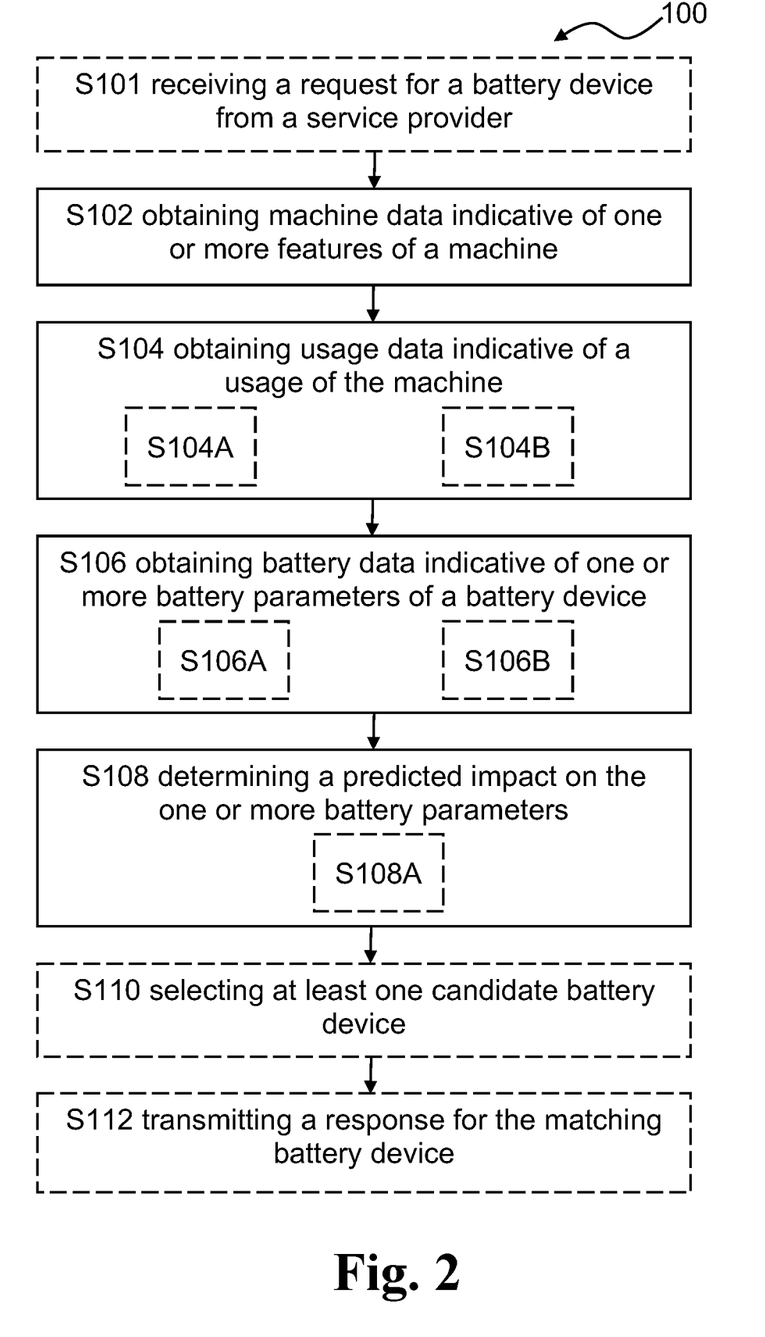
FIG. 2 is a flow-chart illustrating an example method, performed by a server device, for managing one or more battery devices according to this disclosure.

FIG. 2 shows a flow diagram of an example method 100, performed at an example server device according to this disclosure. The method 100 is performed for managing usage of one or more battery devices according to the disclosure. The server device is configured to connect to a communication network. The method is performed at a server device (e.g. the server device disclosed herein, e.g. server device 8 of FIGS. 1A-B, and 3)

The method 100 comprises obtaining S102 machine data indicative of one or more features of a machine. The machine is to be powered by a battery device. The machine is optionally to be used according to a usage type, e.g. by a user. For example, the user may need to be given or to find an appropriate battery device for the machine and its intended use. For example, the user may need to use a battery device for a drilling machine that the user intends to use for drilling 30 holes in a concrete surface. Obtaining S102 the machine data may comprise receiving and/or retrieving the machine data, optionally from a machine characterization unit (such as machine characterization unit 32 of FIG. 1B), from the machine, and/or from a user device.

The machine data may comprise a set of parameters characterizing the machine, such as a hardware parameter, and/or a current consumption parameter (such as a current drain parameter when actively using the machine, and/or a burst current drain time parameter in seconds actively using the machine).

The method 100 comprises obtaining S104 usage data indicative of a usage of the machine. For example, the server device may obtain the usage data indicative of the usage of the machine by a given user, or by a given user type, or based on a machine type. In one or more example methods, obtaining S104 the usage data comprises requesting S104A the usage data from a usage characterization unit configured to collect user data and to determine usage data and receiving S104B the usage data. The usage characterization unit may be as illustrated in FIG. 1B. Obtaining S104 the usage data may comprise receiving and/or retrieving the usage data optionally from a usage characterization unit (such as usage characterization unit 33 of FIG. 1B) configured to collect user data and determine the usage data (such as statistically).

Usage data may refer to data that statistically represents the usage of the machine by a given user and/or an average user over the collected user data. Usage can be characterized by usage data (such as a usage parameter set). For example, the usage data may be in form of statistical figures (such as average figures) representative of the usage of a given machine by a given user and/or a user type. User data may comprise updates from a machine regarding the usage of the machine used e.g. according to a usage type, e.g. by a user, including historical user data. In other words, usage data may be determined based on user data, such as user data collected across users for a given machine, such as user data collected across machines for a given user, such as user data collect across machines and users.

Usage data may be based on a set of individual usage parameter per user or per user type (such as a set of usage profiles). A usage parameter may comprise one or more of: a reloading frequency parameter, a Max and/or min usage level parameter (such as parameter indicative of the usage cycle, Does the user charge in average up to 100% and does the user use the battery device down to 0% remaining capacity?), a maximum current drain parameter, and average current drain parameter, and an average usage time per day parameter.

Usage data may comprise one or more usage parameters, such as one or more of: a current drain parameter (e.g. a current drain when actively using a machine "M"), a burst current drain parameter (e.g. a burst current drain time in seconds actively using the machine "M"), a cycle parameter for the user (such as an average number of cycles per hour for when user "U" is active in usage of the machine "M"), an active hours per day parameter (such as average hours that user "U" is using the machine "M" on a day of usage), an active days per week parameter (such as average days per week that the user "U" is using machine "M").

Usage data may be built so as to describe an expected usage depending on which person is to use the battery device (based on individual personal usage types being different, such as a do-it-yourself-user, a professional user), and depending on which machine is to be supplied by the battery device (such as a specific type of chainsaw, drill, lawn mower etc. . . . ). The usage data may optionally be defined by using data combining for example person "A" using machine type "X". The usage data may be based on user data comprising a user identifier and a machine identifier stored in a usage characterization unit, configured to collect regularly user data and to determine usage data based on the user data. The collecting and storing may be done regularly, such as once per day or similar and being transmitted by a wireless modem connected to the machine.

The method 100 comprises obtaining S106, for one or more battery devices, battery data indicative of one or more battery parameters of a battery device. In one or more example methods, obtaining S106 the battery data comprises requesting S106A the battery data from a battery characterization unit and receiving S106B the battery data. Obtaining S106 the battery data may comprise receiving and/or retrieving the usage data optionally from the one or more battery devices, and/or a battery characterization unit (such as battery characterization unit 30 of FIG. 1B) configured to collect and store battery data from the one or more battery devices.

Battery data of a battery device may comprises one or more of: a maximum voltage parameter (such as Vbat_max=Battery device "B" voltage when it's fully charged), a current voltage parameter (such as Vbat_current=Current battery voltage of battery device "B"), a current drain parameter (such as I_bat=Battery device "B" specified maximum current drain), a capacity parameter (such as Bat_capacity=specified capacity in Ah of battery device "B"), a recharge cycle parameter (such as Bat_cycles=number of recharge cycles battery device "B" has experienced), a maximum recharge cycle parameter (such as Bat_cycles_max=a specified maximum recharge cycles expected for battery device "B").

The method 100 comprises determining S108, for the one or more battery devices, a predicted impact on the one or more battery parameters based on the battery data, the usage data, and the machine data. The predicted impact may be characterized by a predicted impact metric, indicating a predicted degradation of the battery device based on the intended use of the battery device by an intended machine and an intended user. The one or more battery parameters may comprise an expected battery lifetime and/or an expected remaining battery lifetime. The predicted impact on the one or more battery parameters may comprise a predicted impact on battery lifetime and/or remaining battery lifetime. A battery lifetime may refer to how long time the battery device is able to function with a given machine. A remaining battery lifetime may indicate how long the user can use intensively the battery device. The predicted impact of a usage of the machine on the one or more battery parameters may comprise a future matching ratio of a battery device, with a given machine and a given user. For example, the predicted impact may support assessing what is the possible impact of the intended use of the battery device on the battery device health characterized by the one or more battery parameters of the battery device.

By combining battery data, machine data and usage data into a prediction system, the server device disclosed herein can estimate the expected battery life and usage possibility for a different device and a different user compared to how the battery may have been used before.

In one or more example methods, the predicted impact comprises an expected impact per time unit (such as an impact per day, per month) on the expected total battery lifetime estimated in S108. In other words, the predicted impact functionality may indicate how much the battery is going to age from a potential usage of a given machine by a specific user.

The disclosed server device improves the estimation of the predicted impact by taking into account the machine data, the battery data and the usage data. For example, the disclosed server device is capable of estimating a remaining battery life of the battery device assuming that the battery device would be used for a given machine characterized by the machine data and by a given user according to the usage data.

In one or more embodiments, a user may be characterized by one or more user parameters which may be specific per machine. The one or more user parameters may be reflected by the usage data. For example, the same user "U" using a different machine (for example NOT "M") is likely to result in different user parameters and eventually different usage data. In order to handle variations in usage, determining S108 the predicted impact may be performed by applying a factor. The factor may be applied due to uncertainty, (for example, the less usage data is available or stored about a certain user, a larger variance may be applied in the predicted impact (such as the expected future usage). For example, determining S108 the predicted impact may comprise applying a weighting factor based on usage variance. For example, the predicted impact may be scaled depending on the usage data available (such as the amount of statistics available). In one or more example methods, the server device is capable of estimating a predicted impact also for users with relatively low amount of usage data (such as historical data). For example, the server device may be configured to apply one or more margins for a user with clearly varying usage from one time to another.

In an example where the disclosed technique is applied, determining S108 the predicted impact involves performing analysis of remaining battery life estimation of battery device "B" supplying power to machine "M" and to be used by user "U". For example, the server device may estimate remaining battery life by using an estimation function ("C"), (which may be seen as providing a future estimated matching estimate). The function "C" may allow determining an estimated future battery life impact using the input data (such as input parameters) provided based on the usage data, the machine data and the battery data. The function "C" can therefore be a function of B, M and U. This may be expressed as $$C=f(B,M,U)$$

For example, an estimation function "C_charge" may be implemented by calculating an expression of the battery drain level of active usage per hour during a single charge, such as:

$$C\_charge=(Vbat\_current/Vbat\_max)*(I\_machine/I\_bat)*(T\_machine*Cycle\_user)/Bat\_capacity$$

For example, an estimation function "C" may be implemented by calculating an expression of the battery life impact over longer period of time, e.g. a week as for example:

$$C\_long\_use=(Bat\_cycles/Bat\_cycles\_max)*C\_charge*Active\_day\_user*Active\_week\_user$$

These examples are illustrative, to provide implementation examples. The disclosed technique of method 100 may be compatible with a standardized characterization and calculation method to be applied.

In one or more example methods, the method 100 comprises selecting S110 at least one candidate battery device amongst the one or more battery device based on the predicted impact on the one or more battery parameters. For example, the server device may select one candidate battery device based on the predicted impact satisfying a usage criterion. For example, the server device may select at least one battery device with an expected remaining battery lifetime satisfying the usage criterion (for example, the usage criterion may be that no recharge is needed during use).

In one or more example methods, the method 100 comprises receiving S101, via the interface circuitry, a request for a battery device from a service provider (for example from a service provider device (for example a battery rental store, a device rental store)). The request may comprise data indicative of the user (such as a user identifier and/or a user type identifier), of the machine to be used (such as a machine identifier and/or machine data), and/or of a battery to be used (such as a battery identifier). For example, the request may comprise data indicative of the user, of the machine to be used, and/or of a battery type to be used. For example, a battery identifier may comprise a hardware identifier of a battery device, such as a serial number of the battery device. For example, a user identifier may comprise a customer number at a service provider, and/or a hardware identifier of a user device (such as a serial number of the user device, such as a MAC address of the user device).

For example, the request may comprise a request for a battery device that may a candidate battery device to perform an intended task with a specified machine to be used by a given user and/or user type. In other words, the request may be seen as a request to query the server device on "how well would a combination (machine, usage, battery) work together to achieve an intended task". The request may be seen as a request to assess the appropriate battery device, such as how well a battery device matches the request, and/or matches the intended usage. For example, the request may be seen as a matching request.

For example, a response to the request may indicate that the battery device indicated in the request is overskilled and/or overqualified for the intended task (such as, the battery device indicated has more than sufficient power for the intended task). Conversely, a response to the request may indicate a warning flag that the battery device indicated in the request is not suitable for the intended usage with the intended machine (for example based on an assessment by the server device that the battery data indicates a performance below or above an acceptable threshold). In other words, a response to the request may indicate an expected outcome on the battery device if being used for the combination of (machine, usage, battery) indicated in the request.

In one or more examples, the method 100 comprises determining S108, for the one or more battery devices, the predicted impact on the one or more battery parameters is performed based on the battery data, the usage data, the machine data, and the received request. For example, the determining S108, for the one or more battery devices, the predicted impact on the one or more battery parameters is performed based on the battery data indicated in the request, the usage data indicated in the request, the machine data indicated in the request.

This way, the server device and/or the service provider device can, in one or more embodiments, select at least one battery device that can perform the intended task with the machine to be used according to the received request.

In one or more example methods, the method 100 comprises transmitting S112, via the interface circuitry, a response to the service provider. The response may comprise the selected candidate battery device, and/or the predicted impact on the one or more battery parameters and/or an indication on how well a battery device matches the request. For example, a response to the request may indicate that the battery device indicated in the request is overskilled and/or overqualified for the intended task (such as, the battery device indicated has more than sufficient power for the intended task).

Conversely, a response to the request may indicate a warning flag that the battery device indicated in the request is not suitable for the intended usage with the intended machine (for example based on an assessment by the server device that the battery data indicates a performance below or above an acceptable threshold). In other words, a response to the request may indicate an expected outcome on the battery device if being used for the combination of (machine, usage, battery) indicated in the request.

In one or more example methods, determining S108, for the one or more battery devices, the predicted impact on the one or more battery parameters based on the battery data, the usage data and the machine data comprises determining S108A a degradation rate of a corresponding battery device based on the machine data, the usage data and the battery data. The degradation rate may indicate how much the corresponding battery device may be affected by the intended use indicated in the request and may support in estimating the predicted impact.

Figure 3:
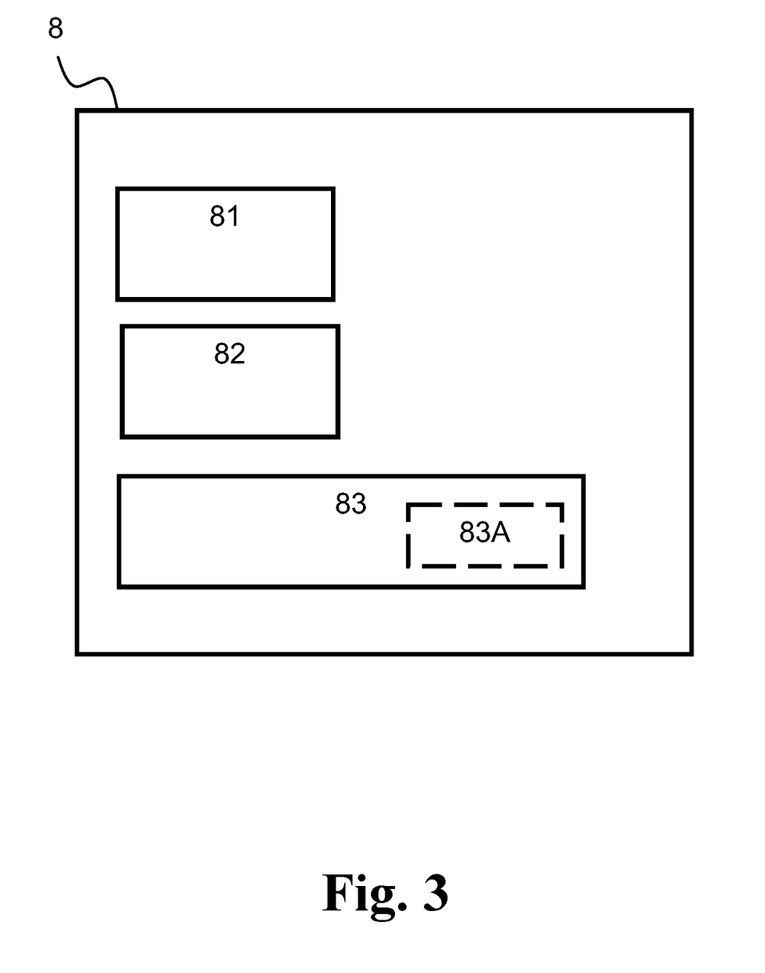
FIG. 3 is a block diagram illustrating an example server device according to this disclosure.

FIG. 3 shows a block diagram of an example server device 8 according to the disclosure. The server device 8 comprises a memory circuitry 81, a processor circuitry 83, and an interface circuitry 82. The server device 8 may be configured to perform any of the methods disclosed in FIG. 2.

The interface circuitry 82 is configured to connect to a communication network (e.g. communication network 18 of FIGS. 1A-B). The communication network may comprise a wired communication network and/or a wireless communication network. The interface circuitry 82 is optionally configured for wireless communications.

The server device 8 is configured to obtain machine data indicative of one or more features of a machine (such as S102 of FIG. 2). The machine is configured to be powered by a battery device. For example, the server device 8 may be configured to obtain machine data indicative of one or more features of a machine, via the interface circuitry 82, optionally from a machine characterization unit, from the machine, and/or from a user device. For example, the server device 8 may be configured to obtain the machine data via the interface circuitry 82 by receiving and/or retrieving the machine data, optionally from a machine characterization unit (such as machine characterization unit 32 of FIG. 1B), from the machine, and/or from a user device. For example, the server device 8 may be configured to obtain machine data from the memory circuitry 81.

The server device 8 is configured to obtain usage data indicative of a usage of the machine (such as S104 of FIG. 2). For example, the server device 8 may be configured to obtain the usage data via the interface circuitry 82 by requesting (S104A of FIG. 2) the usage data from a usage characterization unit configured to collect user data and to determine usage data and receiving (S104B of FIG. 2) the usage data.

In one or more example server devices, the server device 8 is configured to obtain the usage data by requesting the usage data from a usage characterization unit configured to collect user data and to determine usage data and by receiving the usage data.

The server device 8 is configured to obtain, for one or more battery devices, battery data indicative of one or more battery parameters of a battery device (such as S106 of FIG. 2). For example, the server device 8 may be configured to obtain the battery data via the interface circuitry 82 by requesting (S106A of FIG. 2) the battery data from a battery characterization unit and receiving (such as in S106B of FIG. 2) the battery data. Obtaining S106 the battery data may comprise receiving and/or retrieving the usage data optionally from the one or more battery devices, and/or a battery characterization unit (such as battery characterization unit 30 of FIG. 1B) configured to collect and store battery data from the one or more battery devices.

In one or more example server devices, the server device 8 the server device is configured to obtain the battery data by requesting the battery data from a battery characterization unit and by receiving the battery data.

The server device 8 is configured to determine, for the one or more battery devices, a predicted impact on the one or more battery parameters based on the battery data, the usage data, and the machine data (such as S108 of FIG. 2). For example, the processor circuitry 83 may configured to determine (optionally via an estimator circuitry 83A), for the one or more battery devices, a predicted impact on the one or more battery parameters based on the battery data, the usage data, and the machine data. Optionally, the one or more battery parameters comprise an expected battery lifetime and/or an expected remaining battery lifetime.

The disclosed server device improves the estimation of the predicted impact by taking into account the machine data, the battery data and the usage data. For example, the disclosed server device is capable of estimating a remaining battery life of the battery device assuming that the battery device would be used for a given machine characterized by the machine data and by a given user according to the usage data.

In one or more example server devices, the server device 8 is configured to select at least one candidate battery device amongst the one or more battery device based on the predicted impact on one or more of the battery parameters.

In one or more example server devices, the server device 8 is configured to receive, via the interface circuitry 82, a request for a battery device from a service provider (such as from a device of a service provider (e.g. battery rental store, device rental store)). The server device 8 may be configured to determine (optionally via an estimator circuitry 83A), for the one or more battery devices, the predicted impact on one or more of the battery parameters based on the battery data, the usage data, the machine data, and the received request. Optionally, the request comprises data indicative of the user, of the machine to be used, and of a battery or a battery type to be used.

In one or more example server devices, the server device 8 is configured to transmit, via the interface circuitry 82, a response for the matching battery device (such as in S112 of FIG. 2). In one or more example server devices, the response comprises the selected candidate battery device, and/or the predicted impact on one or more of the battery parameters.

In one or more example server devices, the server device 8 is configured to determine, for the one or more battery devices, the predicted impact on one or more of the battery parameters based on the battery data, the usage data, and the machine data by determining a degradation rate of a corresponding battery device based on the machine data, the usage data and the battery data (such as in S108A of FIG. 2).

The server device 8 may be configured to communicate one or more of: a battery device, a battery characterization unit, a machine, a machine characterization unit, a usage characterization unit, a user device, a service provider device (for example see FIGS. 1A-B).

The processor circuitry 83 is optionally configured to perform any of the operations disclosed in FIG. 2 (S101, S102, S104, S104A, S104B, S106, S106A, S106B, S108, S108A, S110, S112). The operations of the server device 8 may be embodied in the form of executable logic routines (e.g., lines of code, software programs, etc.) that are stored on a non-transitory computer readable medium (e.g., the memory circuitry 81) and are executed by the processor circuitry 83).

Furthermore, the operations of the server device 8 may be considered a method that the wireless circuitry is configured to carry out. Also, while the described functions and operations may be implemented in software, such functionality may as well be carried out via dedicated hardware or firmware, or some combination of hardware, firmware and/or software.

The memory circuitry 81 may be one or more of a buffer, a flash memory, a hard drive, a removable media, a volatile memory, a non-volatile memory, a random access memory (RAM), or other suitable device. In a typical arrangement, the memory circuitry 81 may include a non-volatile memory for long term data storage and a volatile memory that functions as system memory for the processor circuitry 83. The memory circuitry 81 may exchange data with the processor circuitry 83 over a data bus. Control lines and an address bus between the memory circuitry 81 and the processor circuitry 83 also may be present (not shown in FIG. 3). The memory circuitry 81 is considered a non-transitory computer readable medium.

The memory circuitry 81 may be configured to store one or more of: battery data, usage data, the predicted impact and machine data, in a part of the memory.

Figure 4:
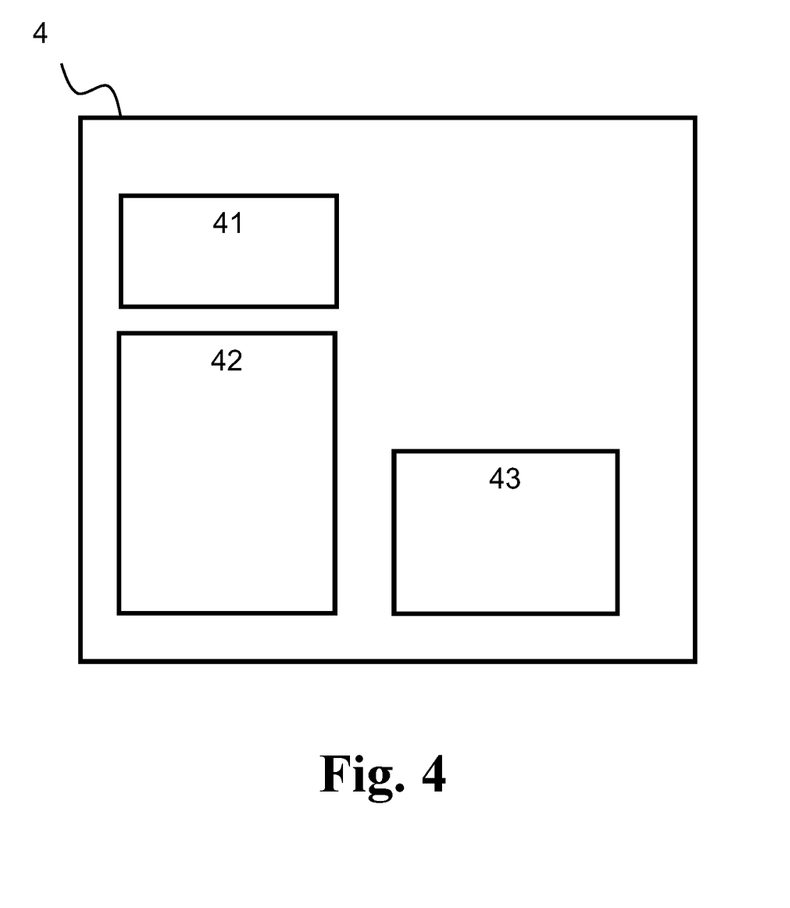
FIG. 4 is a block diagram illustrating an example machine according to this disclosure.

FIG. 4 shows a block diagram of an example machine 4 according to the disclosure. The machine 4 comprises a memory circuitry 41, a processor circuitry 43, and an interface circuitry 42.

The interface circuitry 42 is configured to connect to a communication network (e.g. communication network 18 of FIGS. 1A-B). The communication network may comprise a wired communication network and/or a wireless communication network. The interface circuitry 42 is optionally configured for wireless communications.

The machine 4 is configured transmit, via the interface circuitry 42, user data indicative of a current usage of the machine (according to a usage type, e.g. by a user), for example to the server device disclosed herein, for example to a usage characterization unit disclosed herein. The user data may comprise information regarding usage data indicative of how and who is using a given machine at instant t.

The machine 4 may be configured to communicate one or more of: a battery device, a machine characterization unit, a usage characterization unit, a user device, a server device (for example see FIGS. 1A-B).

The operations of the machine 4 may be embodied in the form of executable logic routines (e.g., lines of code, software programs, etc.) that are stored on a non-transitory computer readable medium (e.g., the memory circuitry 41) and are executed by the processor circuitry 43).

Furthermore, the operations of the machine 4 may be considered a method that the wireless circuitry is configured to carry out. Also, while the described functions and operations may be implemented in software, such functionality may as well be carried out via dedicated hardware or firmware, or some combination of hardware, firmware and/or software.

The memory circuitry 41 may be one or more of a buffer, a flash memory, a hard drive, a removable media, a volatile memory, a non-volatile memory, a random access memory (RAM), or other suitable device. In a typical arrangement, the memory circuitry 41 may include a non-volatile memory for long term data storage and a volatile memory that functions as system memory for the processor circuitry 43. The memory circuitry 41 may exchange data with the processor circuitry 43 over a data bus. Control lines and an address bus between the memory circuitry 41 and the processor circuitry 43 also may be present (not shown in FIG. 4). The memory circuitry 41 is considered a non-transitory computer readable medium.

The memory circuitry 41 may be configured to store one or more of: usage data, and machine data, in a part of the memory.

Figure 5:
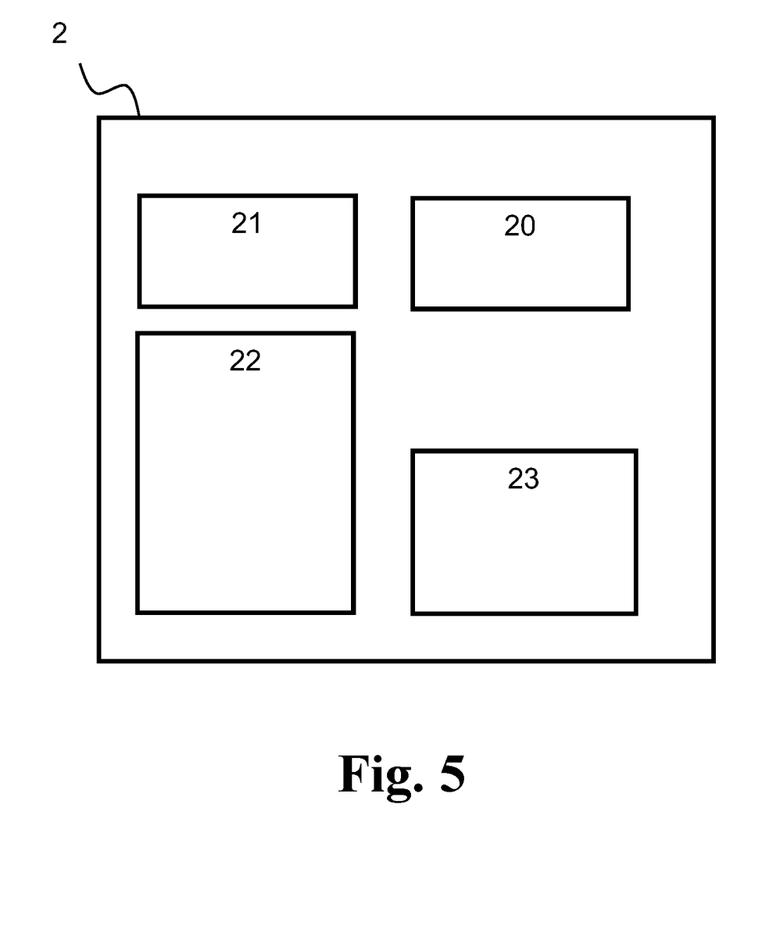
FIG. 5 is a block diagram illustrating an example battery device according to this disclosure.

FIG. 5 shows a block diagram of an example battery device 2 according to the disclosure.

The interface circuitry 22 is configured to connect to a communication network (e.g. communication network 18 of FIGS. 1A-B). The communication network may comprise a wired communication network and/or a wireless communication network. The interface circuitry 22 is optionally configured for wireless communications.

The battery device 2 is configured to power a machine when coupled to the machine (such as machine 4 of FIGS. 1A-B, 4). The battery device 2 comprises a battery pack 20 for storing electrical energy and having a contact for supplying power to the machine. The battery pack 20 can have different capacities depending on the type of machines it is intended to be used with.

The contact for supplying power to the machine is positioned so that electrical connection to the machine is established when the battery device is inserted into or connected to the main device. The battery device 2 may comprise a power supply controller at a line between the battery pack 20 and contact. The power supply controller is connected to the processor circuitry 23, allowing the processor circuitry to control the power supply from the battery pack 12 to the machine. The battery pack may be rechargeable and the battery device 2 may have a socket or similar for connecting the battery pack to an external charge reservoir, e.g. via a charging station or a charge cable. The socket may be provided by the contact for supplying power to the machine.

The battery device 2 comprises a memory circuitry 21, a processor circuitry 23, and an interface circuitry 22 for communicating with a communication network (e.g. communication network 18 of FIGS. 1A-B).

The battery device 2 is configured to transmit, via the interface circuitry 22, user data indicative of a current usage of the machine, for example to the server device disclosed herein, for example to a battery characterization unit disclosed herein, and/or for example to a usage characterization unit disclosed herein. The user data may comprise information regarding usage data indicative of how and who is using a given machine at instant t.

The battery device 2 may be configured to communicate one or more of: a machine, a battery characterization unit, a usage characterization unit, a user device, a server device (for example see FIGS. 1A-B).

The operations of the battery device 2 may be embodied in the form of executable logic routines (e.g., lines of code, software programs, etc.) that are stored on a non-transitory computer readable medium (e.g., the memory circuitry 21) and are executed by the processor circuitry 23).

Furthermore, the operations of the battery device 2 may be considered a method that the wireless circuitry is configured to carry out. Also, while the described functions and operations may be implemented in software, such functionality may as well be carried out via dedicated hardware or firmware, or some combination of hardware, firmware and/or software.

The memory circuitry 21 may be one or more of a buffer, a flash memory, a hard drive, a removable media, a volatile memory, a non-volatile memory, a random access memory (RAM), or other suitable device. In a typical arrangement, the memory circuitry 21 may include a non-volatile memory for long term data storage and a volatile memory that functions as system memory for the processor circuitry 23. The memory circuitry 21 may exchange data with the processor circuitry 23 over a data bus. Control lines and an address bus between the memory circuitry 21 and the processor circuitry 23 also may be present (not shown in FIG. 5). The memory circuitry 21 is considered a non-transitory computer readable medium.

The memory circuitry 21 may be configured to store one or more of: battery data, in a part of the memory and optionally usage data.

Figure 6:
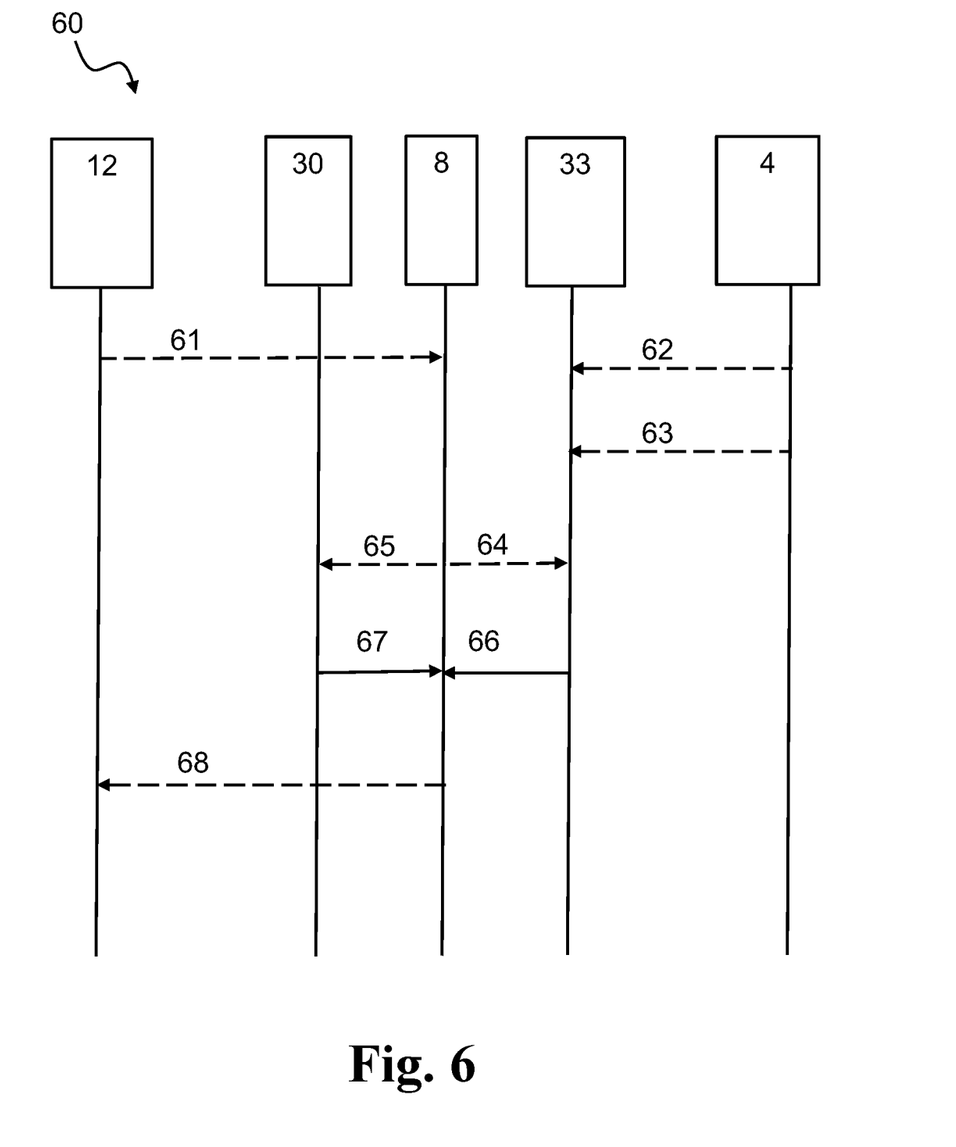
FIG. 6 is a signalling diagram according to an example of this disclosure.

FIG. 6 is a signalling diagram 60 according to an example of this disclosure. A service provide device 12 may transmit a request 61 for a battery device to a server device 8.

The server device 8 obtains usage data 66 and/or machine data by sending a data query 64 to a usage characterization unit 33.

The usage characterization unit 33 is connected to one or more machines 4 from which the usage characterization unit 33 may receive user data 62, 63. The usage characterization unit 33 is configured to determined usage data based on user data as disclosed herein.

The server device 8 obtains battery data 67 by sending a data query 65 to a battery characterization unit 30.

The server device 8 determines (see S108 of FIG. 2) a predicted impact of an intended usage on one or battery parameters of respective battery device(s) based on the obtained usage data and battery data. The usage data may comprise machine data.

The server device 8 may transmit a response 68 to the service provider device 12.

It may be appreciated that the usage characterization unit 33 is configured to collect user data related to usage being signaled from connected machines 4, and to characterize the user data into usage data. The usage data is combined with battery data from the battery characterization unit 30 to define a combined estimation of a future impact (for example leading to such as a future matching ratio), where the combination may be performed via a mathematical weighting function. The estimated impact (for example the estimated matching ratio) may be signaled in 68 from the server device 8 to entities requesting such estimation, in order to determine the suitability between different combinations of battery device, user and machine.

Embodiments of methods and products (server devices, machines, battery devices, systems and service provider devices) according to the disclosure are set out in the following items:

Item 1. A server device comprising a processing circuitry, a memory circuitry, an interface circuitry configured to connect to a communication network, wherein the server device is configured to:
  obtain machine data indicative of one or more features of a machine, wherein the machine is configured to be powered by a battery device;
  obtain usage data indicative of a usage of the machine;
  obtain, for one or more battery devices, battery data indicative of one or more battery parameters of a battery device; and
  determine, for the one or more battery devices, a predicted impact on the one or more battery parameters based on the battery data, the usage data, and the machine data.

Item 2. The server device according to item 1, wherein the server device is configured to select at least one candidate battery device amongst the one or more battery device based on the predicted impact on the one or more battery parameters.

Item 3. The server device according to any of items 1-2, wherein the server device is configured to receive, via the interface circuitry, a request for a battery device from a service provider, and wherein the server device is configured to determine, for the one or more battery devices, the predicted impact on the one or more battery parameters based on the battery data, the usage data, the machine data, and the received request.

Item 4. The server device according to item 3, wherein the request comprises data indicative of the user, of the machine to be used, and of a battery or a battery type to be used.

Item 5. The server device according to any of items 2-4, wherein the server device is configured to transmit, via the interface circuitry, a response for the battery device, wherein the response comprises the selected candidate battery device, and/or the predicted impact on the one or more battery parameters.

Item 6. The server device according to any of items 1-5, wherein the server device is configured to determine, for the one or more battery devices, the predicted impact on the one or more battery parameters based on the battery data, the usage data, and the machine data by determining a degradation rate of a corresponding battery device based on the machine data, the usage data and the battery data.

Item 7. The server device according to any of items 1-6, wherein the server device is configured to obtain the usage data by requesting the usage data from a usage characterization unit configured to collect user data and to determine usage data and by receiving the usage data.

Item 8. The server device according to any of items 1-7, wherein the server device is configured to obtain the battery data by requesting the battery data from a battery characterization unit and by receiving the battery data.

Item 9. A machine configured to be powered by an external battery device, the machine comprising a processing circuitry, a memory circuitry, an interface circuitry configured to connect to a communication network, wherein the machine is configured to transmit, via the interface circuitry, user data indicative of a current usage of the machine.

Item 10. A battery device configured to power a machine, the battery device comprising
 a battery pack for storing electrical energy and having a contact for supplying power to the machine;
 a processing circuitry and a memory circuitry; and
 an interface circuitry for communicating with a communication network;
wherein the battery device is configured to transmit, via the interface circuitry, user data indicative of a current usage of the machine.

Item 11. A service provider device comprising a processing circuitry, a memory circuitry, an interface circuitry configured to connect to a communication network, wherein the service provider device is configured to transmit, to a server device, a request for a matching battery device and to receive a response.

Item 12. A system comprising:
 a server device according to any of items 1-8;
 a battery device, and
 a machine.

Item 13. A method, performed by a server device, for managing usage of one or more battery devices, wherein the server device is configured to connect to a communication network, the method comprising:
 obtaining (S102) machine data indicative of one or more features of a machine, wherein the machine is configured to be powered by a battery device;
 obtaining (S104) usage data indicative of a usage of the machine;
 obtaining (S106), for one or more battery devices, battery data indicative of one or more battery parameters of a battery device; and
 determining (S108), for the one or more battery devices, a predicted impact on the one or more battery parameters based on the battery data, the usage data, and the machine data.

Item 14. The method according to item 13, the method comprising selecting (S110) at least one candidate battery device amongst the one or more battery device based on the predicted impact on the one or more battery parameters.

Item 15. The method according to any of items 13-14, the method comprising receiving (S101), via the interface circuitry, a request for a battery device from a service provider, and
 wherein determining (S108), for the one or more battery devices, the predicted impact on the one or more battery parameters is performed based on the battery data, the usage data, the machine data, and the received request.

Item 16. The method according to any of items 13-15, the method comprising transmitting (S112), via the interface circuitry, a response for the matching battery device, wherein the response comprises the selected candidate battery device, and/or the predicted impact on the one or more battery parameters.

Item 17. The method according to any of items 13-16, wherein determining (S108), for the one or more battery devices, the predicted impact on the one or more battery parameters based on the battery data, the usage data, and the machine data comprises determining (S108A) a degradation rate of a corresponding battery device based on the machine data, the usage data and the battery data.

Item 18. The method according to any of items 13-17, wherein obtaining (S104) the usage data comprises requesting (S104A) the usage data from a usage characterization unit configured to collect user data and to determine usage data and receiving (S104B) the usage data.

Item 19. The method according to any of items 13-18, wherein obtaining (S106) the battery data comprises requesting (S106A) the battery data from a battery characterization unit and receiving (S106B) the battery data.

The use of the terms "first", "second", "third" and "fourth", "primary", "secondary", "tertiary" etc. does not imply any particular order, but are included to identify individual elements. Moreover, the use of the terms "first", "second", "third" and "fourth", "primary", "secondary", "tertiary" etc. does not denote any order or importance, but rather the terms "first", "second", "third" and "fourth", "primary", "secondary", "tertiary" etc. are used to distinguish one element from another. Note that the words "first", "second", "third" and "fourth", "primary", "secondary", "tertiary" etc. are used here and elsewhere for labelling purposes only and are not intended to denote any specific spatial or temporal ordering. Furthermore, the labelling of a first element does not imply the presence of a second element and vice versa.

It may be appreciated that FIGS. 1A-6 comprises some circuitries or operations which are illustrated with a solid line and some circuitries or operations which are illustrated with a dashed line. The circuitries or operations which are comprised in a solid line are circuitries or operations which are comprised in the broadest example embodiment. The circuitries or operations which are comprised in a dashed line are example embodiments which may be comprised in, or a part of, or are further circuitries or operations which may be taken in addition to the circuitries or operations of the solid line example embodiments. It should be appreciated that these operations need not be performed in order presented. Furthermore, it should be appreciated that not all of the operations need to be performed. The example operations may be performed in any order and in any combination.

It is to be noted that the word "comprising" does not necessarily exclude the presence of other elements or steps than those listed.

It is to be noted that the words "a" or "an" preceding an element do not exclude the presence of a plurality of such elements.

It should further be noted that any reference signs do not limit the scope of the claims, that the example embodiments may be implemented at least in part by means of both hardware and software, and that several "means", "units" or "devices" may be represented by the same item of hardware.

The various example methods, devices, nodes and systems described herein are described in the general context of method steps or processes, which may be implemented in one aspect by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Generally, program circuitries may include routines, programs, objects, components, data structures, etc. that perform specified tasks or implement specific abstract data types. Computer-executable instructions, associated data structures, and program circuitries represent examples of program code for executing steps of the methods disclosed herein. The particular sequence of such executable instructions or associated data structures represents examples of corresponding acts for implementing the functions described in such steps or processes.

Although features have been shown and described, it will be understood that they are not intended to limit the claimed disclosure, and it will be made obvious to those skilled in the art that various changes and modifications may be made without departing from the scope of the claimed disclosure. The specification and drawings are, accordingly to be regarded in an illustrative rather than restrictive sense. The claimed disclosure is intended to cover all alternatives, modifications, and equivalents.

The invention claimed is:

1. A server device comprising a processing circuitry, a memory circuitry, and an interface circuitry configured to connect to a communication network, wherein the server device is configured to perform operations comprising:
   obtaining machine data indicative of one or more features of a machine, wherein the machine is configured to be powered by a respective battery device of one or more battery devices;
   receiving by the server device, from an interface circuitry of the battery device over the communication network, usage data indicative of a usage of the machine;
   receiving by the server device, from the interface circuitry of the battery device over the communication network, for one or more battery devices, battery data indicative of one or more battery parameters of a battery device; and
   determining, for the one or more battery devices, a predicted impact on the one or more battery parameters based on the battery data, the usage data, and the machine data,
   wherein the server device is configured to receive, via the interface circuitry of the server device, a request for a battery device from a service provider, and
   wherein the server device is configured to determine, for the one or more battery devices, the predicted impact on the one or more battery parameters based on the battery data, the usage data, the machine data, and the request that was received.

2. The server device according to claim 1, wherein the server device is configured to select at least one candidate battery device amongst the one or more battery devices based on the predicted impact on the one or more battery parameters.

3. The server device according to claim 1, wherein the request comprises data indicative of a user of the machine to be used, and of a battery or a battery type to be used.

4. The server device according to claim 2,
   wherein the server device is configured to transmit, via the interface circuitry, a response for the battery device,
   wherein the response comprises the at least one candidate battery device that was selected, and/or the predicted impact on the one or more battery parameters.

5. The server device according to claim 1, wherein the server device is configured to determine, for the one or more battery devices, the predicted impact on the one or more battery parameters based on the battery data, the usage data, and the machine data by determining a degradation rate of a corresponding battery device based on the machine data, the usage data and the battery data.

6. The server device according to claim 1, wherein the server device is configured to obtain the usage data by performing operations comprising:
   requesting the usage data from a usage characterization unit configured to collect user data, and to determine usage data; and
   receiving the usage data.

7. The server device according to claim 1, wherein the server device is configured to obtain the battery data by performing operations comprising:
   requesting the battery data from a battery characterization unit, and
   receiving the battery data.

8. A battery device configured to power a machine, the battery device comprising:
   a battery pack configured to store electrical energy and having a contact for supplying power to the machine;
   a processing circuitry and a memory circuitry; and
   an interface circuitry for communicating with a communication network,
   wherein the battery device is configured to transmit, via the interface circuitry over the communication network, user data indicative of a current usage of the machine to a server device.

9. A system comprising:
   a server device according to claim 1;
   a battery device; and
   a machine.

10. A method, performed by a server device, for managing usage of one or more battery devices, wherein the server device is configured to connect to a communication network, the method comprising:
    obtaining machine data indicative of one or more features of a machine, wherein the machine is configured to be powered by a respective battery device of one or more battery devices;

receiving by the server device, from an interface circuitry of the battery device over the communication network, usage data indicative of a usage of the machine;

receiving by the server device, from the interface circuitry of the battery device over the communication network, for one or more battery devices, battery data indicative of one or more battery parameters of a battery device; and determining, for the one or more battery devices, a predicted impact on the one or more battery parameters based on the battery data, the usage data, and the machine data.

11. The method according to claim 10, the method further comprising:

selecting at least one candidate battery device amongst the one or more battery device based on the predicted impact on the one or more battery parameters.

12. The method according to claim 10, the method further comprising:

receiving, via interface circuitry, a request for a battery device from a service provider, wherein determining, for the one or more battery devices, the predicted impact on the one or more battery parameters is performed based on the battery data, the usage data, the machine data, and the request that was received.

13. The method according to claim 10, the method further comprising:

transmitting, via interface circuitry, a response for a matching battery device, wherein the response comprises the candidate battery device that was selected, and/or the predicted impact on the one or more battery parameters.

14. The method according to claim 10, wherein determining, for the one or more battery devices, the predicted impact on the one or more battery parameters based on the battery data, the usage data, and the machine data comprises determining a degradation rate of a corresponding battery device based on the machine data, the usage data and the battery data.

15. The method according to claim 10, wherein obtaining the usage data comprises:

requesting the usage data from a usage characterization unit configured to collect user data and to determine usage data; and receiving the usage data.

16. The method according to claim 10, wherein obtaining the battery data comprises requesting the battery data from a battery characterization unit and receiving the battery data.

* * * * *